(12) United States Patent
Chen

(10) Patent No.: US 7,235,185 B2
(45) Date of Patent: Jun. 26, 2007

(54) METHOD OF PROTECTING WAFER FRONT PATTERN AND METHOD OF PERFORMING DOUBLE-SIDED PROCESS

(75) Inventor: I-Ju Chen, Tao-Yuan Hsien (TW)

(73) Assignee: Touch Micro-System Technology Inc., Yang-Mei, Taoyuan Hsien (TW)

( * ) Notice: Subject to any disclaimer, the term of this patent is extended or adjusted under 35 U.S.C. 154(b) by 0 days.

(21) Appl. No.: 11/163,989

(22) Filed: Nov. 7, 2005

(65) Prior Publication Data

US 2007/0026674 A1 Feb. 1, 2007

(30) Foreign Application Priority Data

Jul. 29, 2005 (TW) .............................. 94125979 A

(51) Int. Cl.
*B44C 1/22* (2006.01)
*H01L 21/301* (2006.01)

(52) U.S. Cl. ..................... 216/88; 216/17; 216/39; 438/692; 438/928

(58) Field of Classification Search ................. 216/17, 216/39, 88; 438/692, 928, 693
See application file for complete search history.

(56) References Cited

U.S. PATENT DOCUMENTS 6,331,449 B1 * 12/2001 Ohsumi ..................... 438/113
6,391,800 B1 * 5/2002 Redd et al. ................. 438/782

FOREIGN PATENT DOCUMENTS

| JP | 62-132343 | * | 6/1987 |
| JP | 62-299071 | * | 12/1987 |
| JP | 03-101128 | * | 4/1991 |
| JP | 05-109679 | * | 4/1993 |
| JP | 07-333854 | * | 12/1995 |

* cited by examiner

*Primary Examiner*—George A. Goudreau
(74) *Attorney, Agent, or Firm*—Winston Hsu

(57) ABSTRACT

A wafer comprising a front surface and a back surface is provided. The wafer further includes a front pattern on the front surface, the front pattern having a plurality of holes. A low-viscosity fluid is formed on the front surface and filled into the holes. Following that, a high-viscosity fluid is formed and filled into the holes by diffusion.

7 Claims, 10 Drawing Sheets

METHOD OF PROTECTING WAFER FRONT PATTERN AND METHOD OF PERFORMING DOUBLE-SIDED PROCESS

BACKGROUND OF THE INVENTION

1. Field of the Invention

The present invention relates to a method of protecting a wafer front pattern, and more particularly, to a method of performing double-sided process capable of protecting a wafer front pattern.

2. Description of the Prior Art

MEMS devices, such as micro-sensors, micro-actuators, and microphones, have more complicated mechanical structures than semiconductor devices, e.g. micro-spindle structures and diaphragm structures, and thus must be fabricated by double-sided processes. However, double-sided processes are not standard semiconductor processes, and thus the manufactures face a lot of difficulties. Specifically, double-sided processes are performed with front processes including a deposition process, lithography process, and etching process, to form a front pattern on the front surface of a wafer. After that, the wafer is turned over and back processes are performed to form a back pattern on the back surface of the wafer. Double-sided processes are for the purpose of fabricating the essential structure of the device. Before performing double-sided processes, the wafer front pattern must be protected from damage during the subsequent back processes or transportation.

Please refer to FIG. 1 through FIG. 3. FIG. 1 through FIG. 3 are schematic diagrams illustrating a conventional method of performing double-sided processes. As shown in FIG. 1, a wafer 10 including a front surface 12 and a back surface 14 is provided. The front surface 12 of the wafer 10 has undergone front processes, such as a deposition process, lithography process, and etching process, to form a front pattern 16. The front pattern 16 comprises a plurality of holes 16A and 16B with different ratios of depth to width. As shown in FIG. 2, a photoresist 18 is spun on the front surface 12 of the wafer 10 to protect the front pattern 16. As shown in FIG. 3, the wafer 10 is turned over and then attached and fixed by an electrostatic chuck (E-chuck) 20 in order to proceed with the back processes.

As shown in FIG. 2 and FIG. 3, however, the photoresist 18, which works as a mask, has a higher viscosity. While the holes 16A of the front pattern 16 have a large ratio of depth to width, the photoresist 18 cannot penetrate the holes 16A completely which results in gas (bubbles) 18A formation. Under these circumstances, the gas 18A will expand by heat and cause a "popcorn effect" during a heating process of the back processes or a process of a higher temperature. The popcorn effect can result in cracks on the surface of photoresist 18 which thus loses the ability to protect the front surface 12 of the wafer 10. This also leads to the attachment and fixation of the wafer 10 by the electrostatic chuck 20 to be more difficult. In addition, if the gas 18A is located near structure of the device, it can damage the structure.

In light of the drawbacks of the above-mentioned method, especially to a wafer having a large ratio of depth to width, the yield is required to be improved.

SUMMARY OF THE INVENTION

It is therefore a primary object of the present invention to provide a method of protecting a wafer front pattern and a method of performing a double-sided process capable of protecting a wafer front pattern, to overcome the problems of the aforementioned techniques.

According to the claimed invention, a method of protecting a wafer front pattern is disclosed. A wafer is provided. The wafer comprises a front surface, a back surface, and a front pattern disposed on the front surface, the front pattern having a plurality of holes. A low-viscosity fluid is formed on the front surface of the wafer and filled into the holes. After that, a high-viscosity fluid is formed on the front surface of the wafer and filled into the holes.

According to the claimed invention, another method of performing a double-sided process capable of protecting a wafer front pattern is disclosed. A wafer is provided. The wafer comprises a front surface, a back surface, and a front pattern disposed on the front surface of the wafer. A low-viscosity fluid is formed on the front surface of the wafer and filled into the holes. After that, a high-viscosity fluid is formed on the front surface of the wafer and filled into the holes by diffusion. Afterward, the front surface of the wafer is attached to a supporting carrier and a back process is performed on the back surface of the wafer.

In accordance with the method of the present invention, a low-viscosity fluid is formed on the front surface of the wafer. Then, a high-viscosity fluid is formed on the front surface of the wafer and filled into the holes by diffusion. Thus, the high-viscosity fluid fills holes completely and forms a protecting cap to protect the wafer front pattern effectively.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
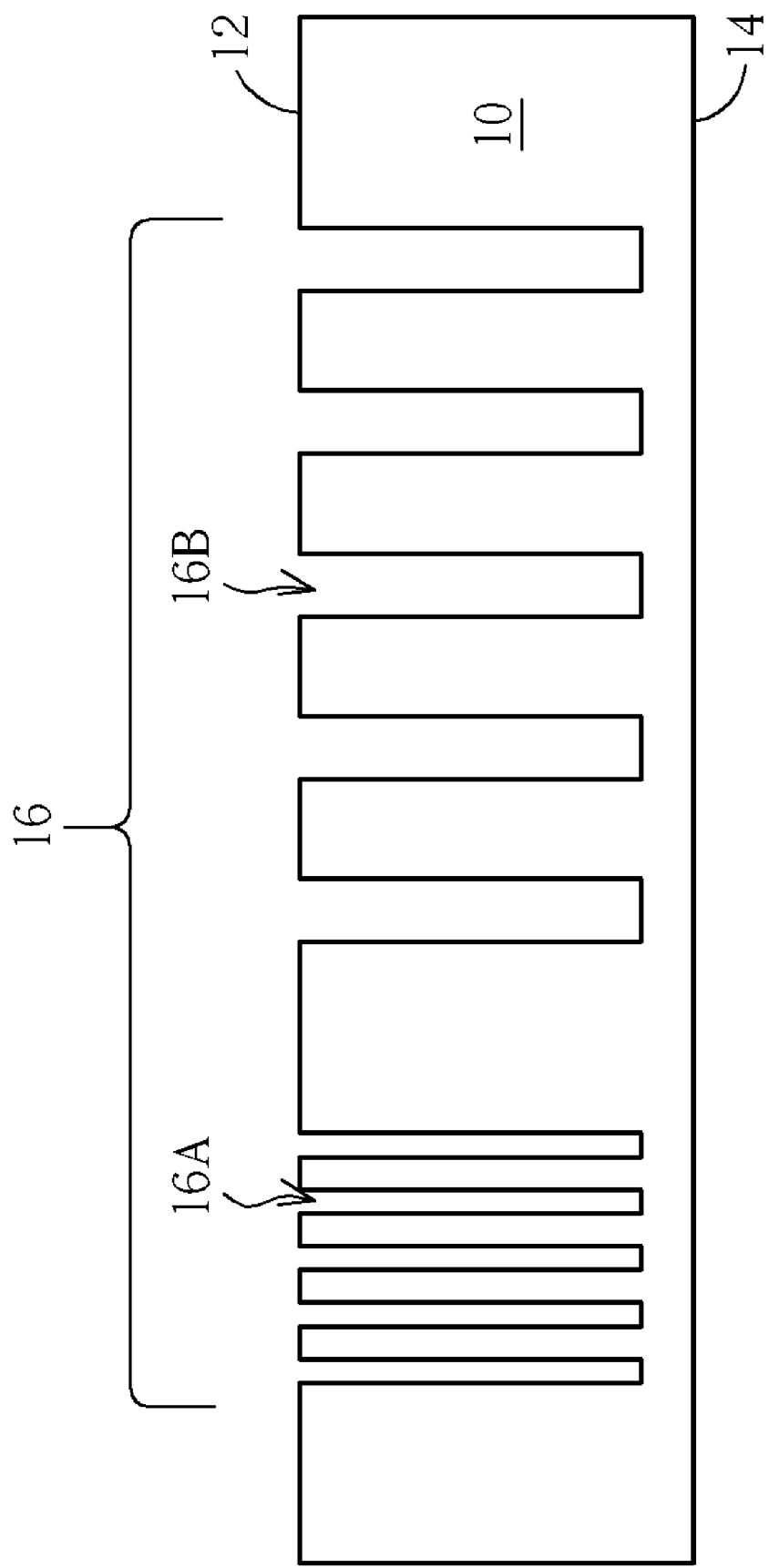
FIG. 1 through FIG. 3 are schematic diagrams illustrating a conventional method of performing a double-sided process.
Figure 2:
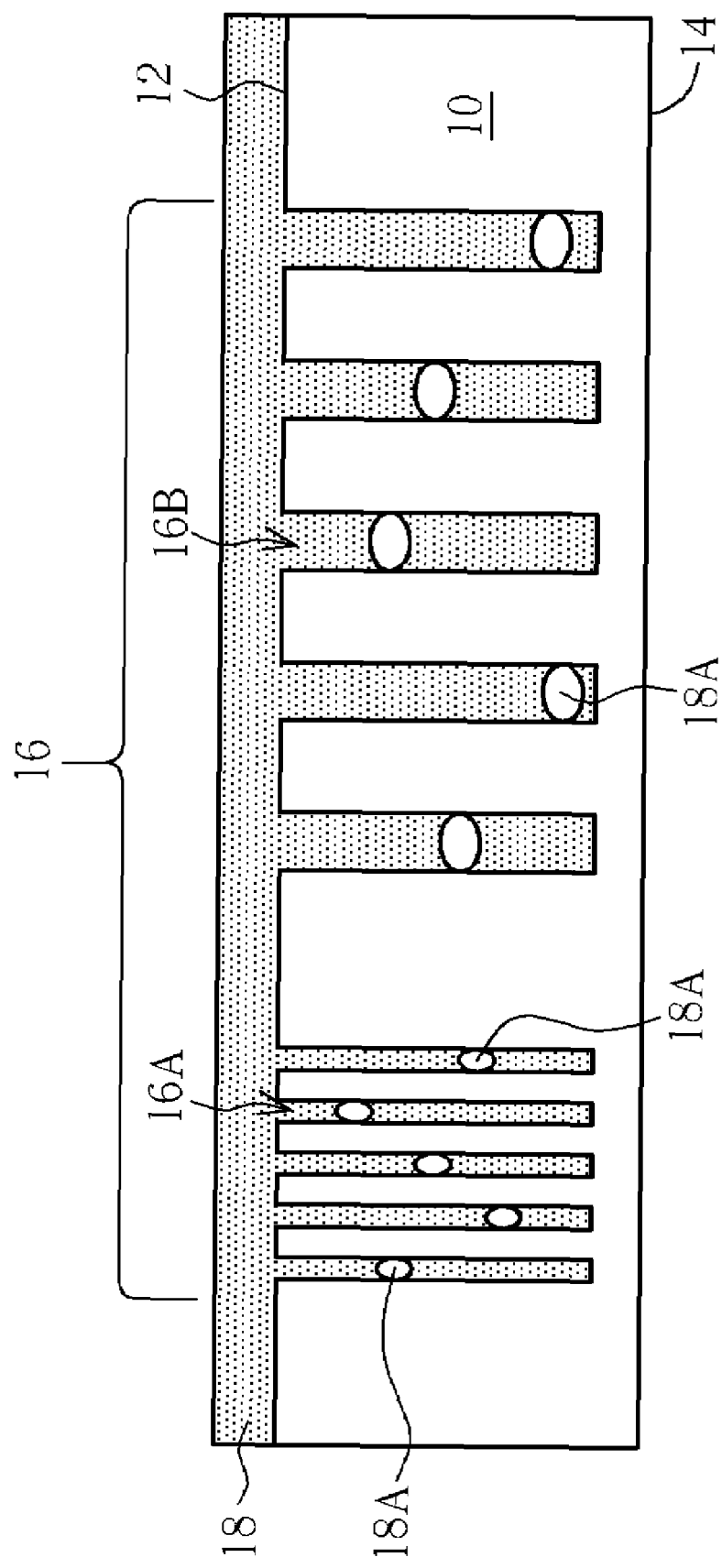
Figure 3:
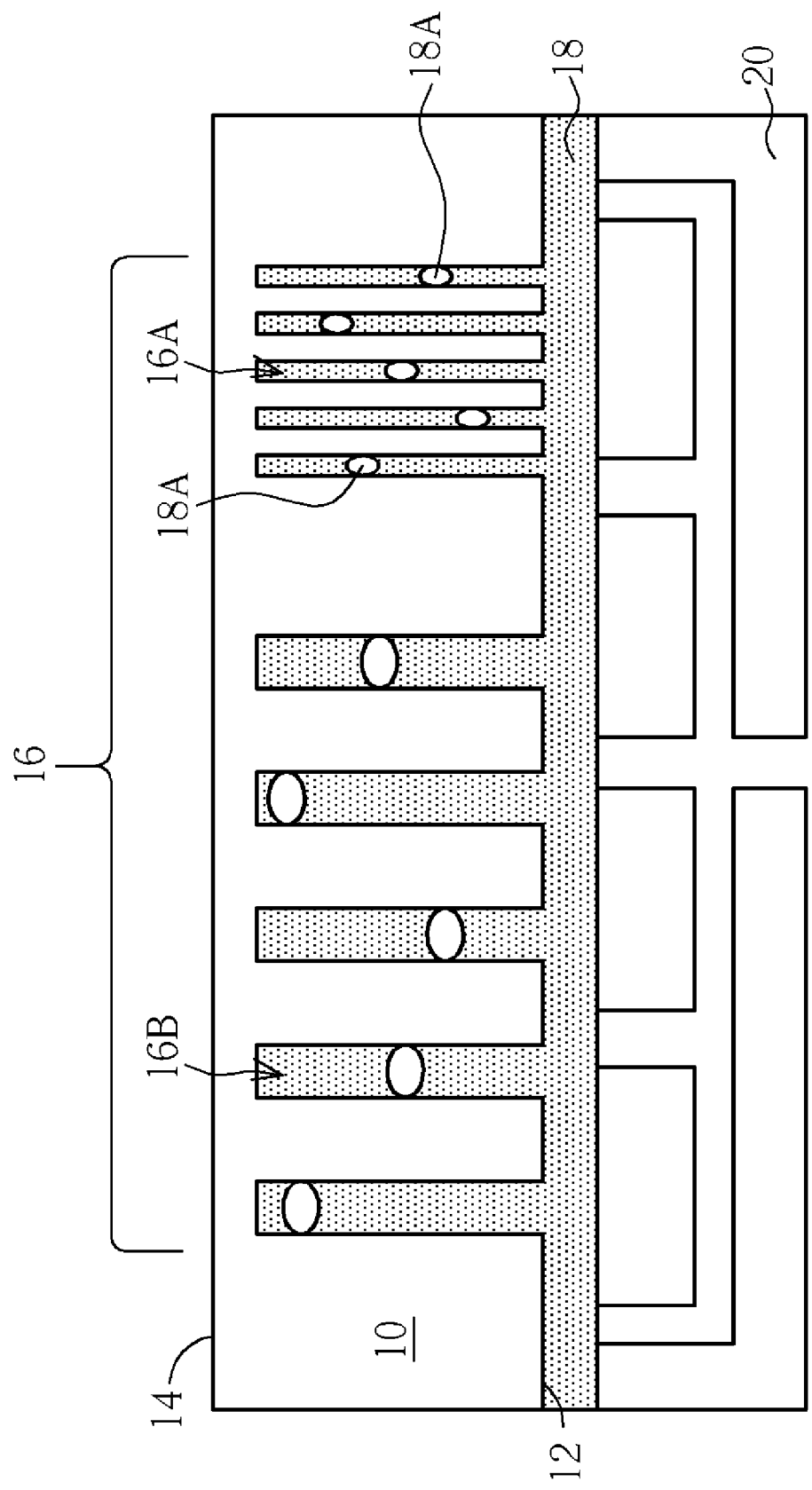
Figure 4:
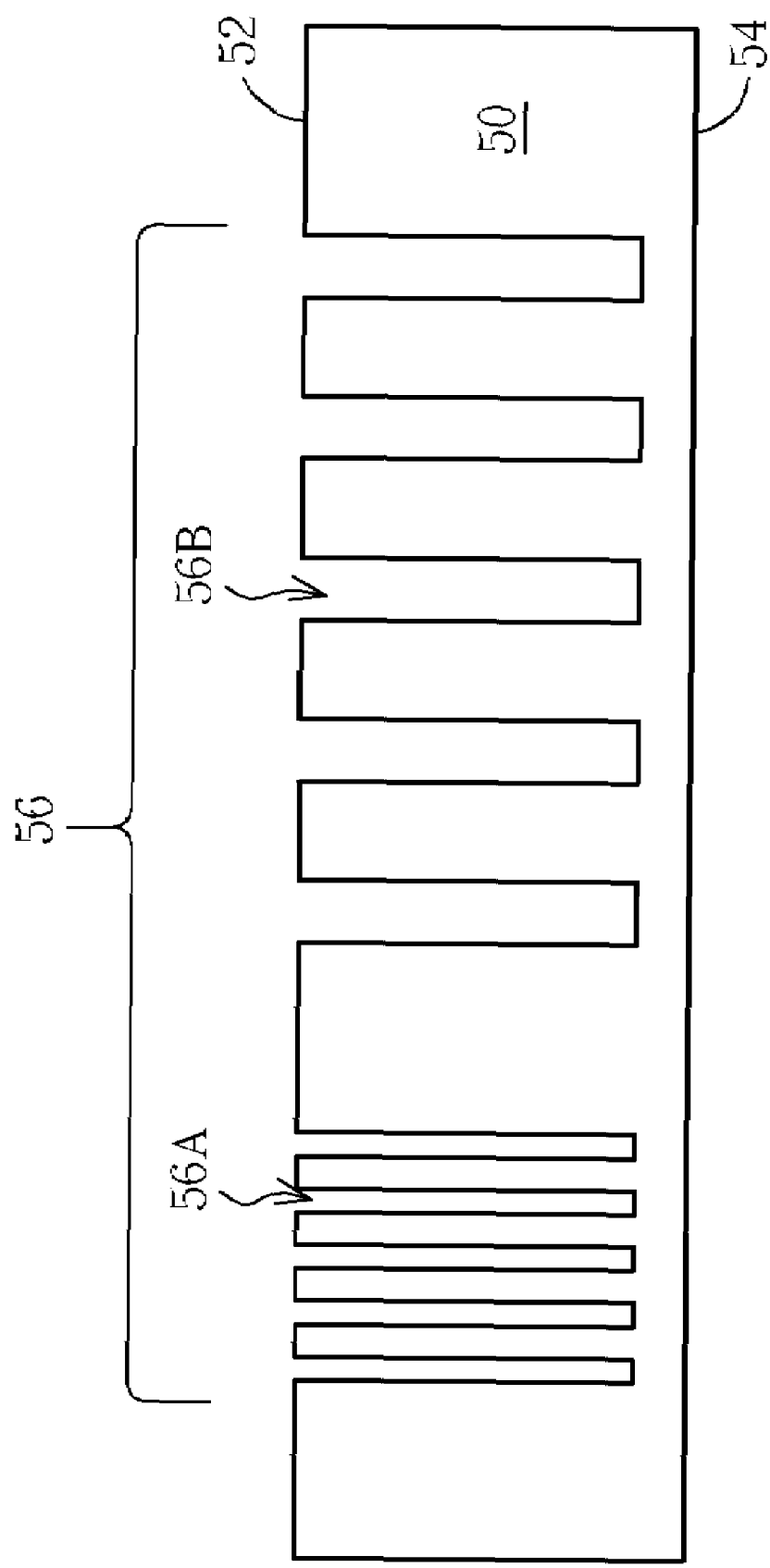
FIG. 4 through FIG. 10 are schematic diagrams illustrating a method of protecting a wafer front pattern according to a preferred embodiment of the present invention.
Figure 5:
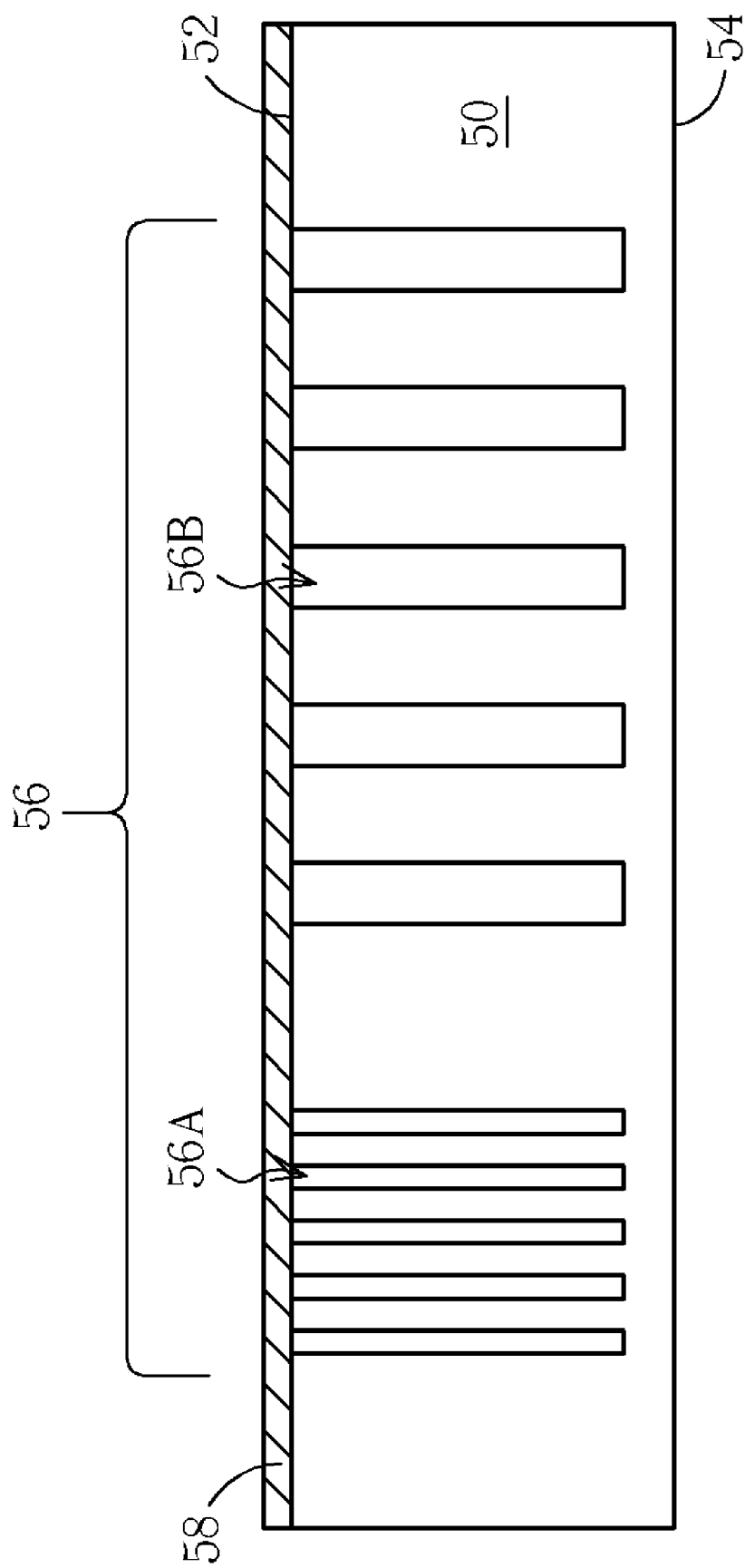

Please refer to FIG. 4 through FIG. 10. FIG. 4 through FIG. 10 are schematic diagrams illustrating a method of protecting a wafer front pattern according to a preferred embodiment of the present invention. As shown in FIG. 4, a wafer 50 including a front surface 52 and a back surface 54 is provided. Front processes, such as a deposition process, lithography process, and etching process have been performed to form a front pattern 56 on the front surface 52 of the wafer 50. The front pattern 56 comprises a plurality of holes 56A and 56B with different ratios of depth to width. As shown in FIG. 5, a low-viscosity fluid (first photoresist solution) 58 is formed on the front surface 52 of the wafer 50 by spinning-on or by another method. The low-viscosity fluid 58 has a viscosity index of between 10 and 50 centipoise (cP) and a preferred viscosity index of 20 cP. In the present embodiment, the low-viscosity fluid 58 is a photoresist solution and the range of viscosity index is obtained by adjusting the composition of solutes and solvents. The low-viscosity fluid 58 can be another fluid and can include additives as required.

Figure 6:
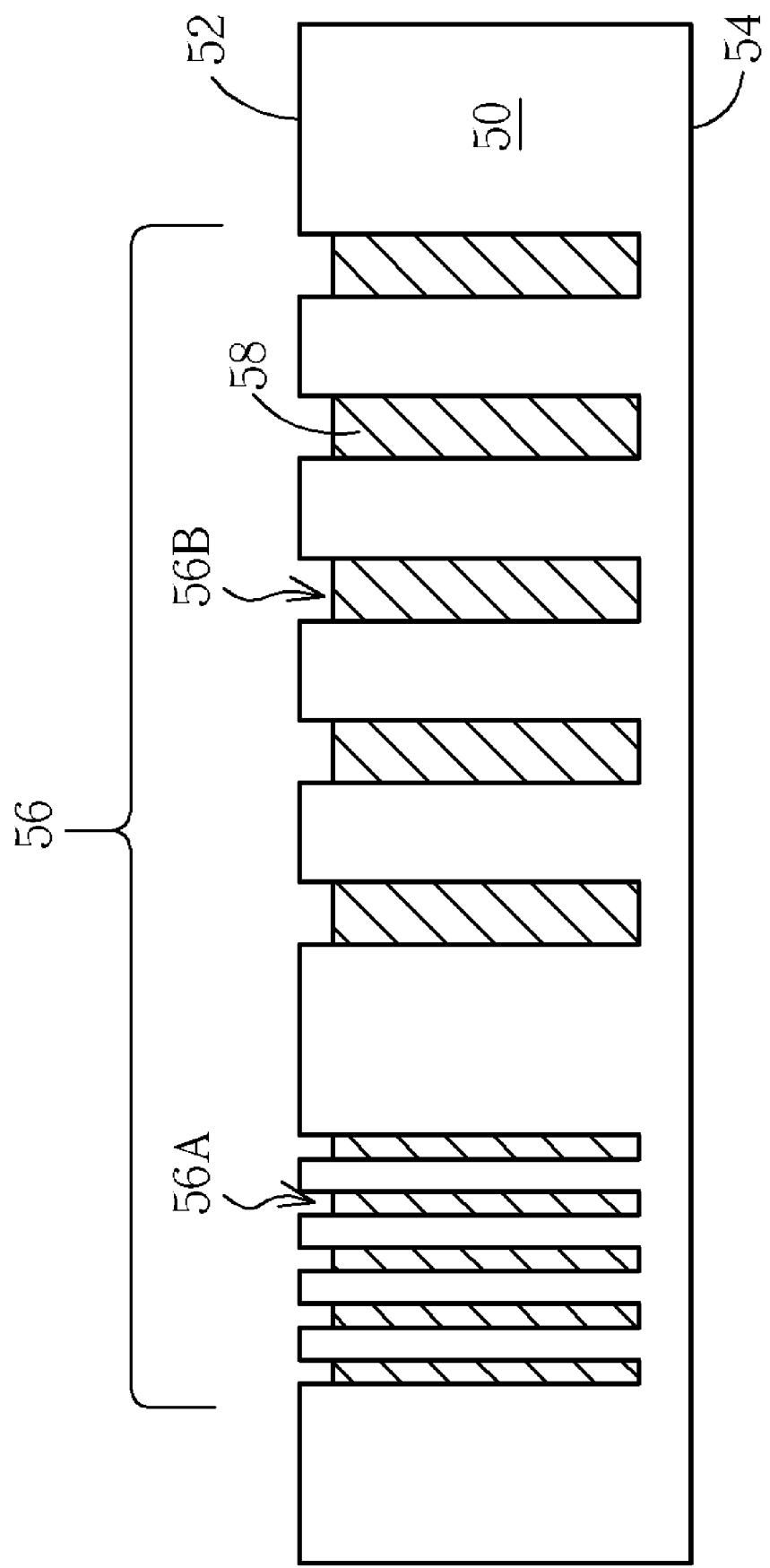
Figure 7:
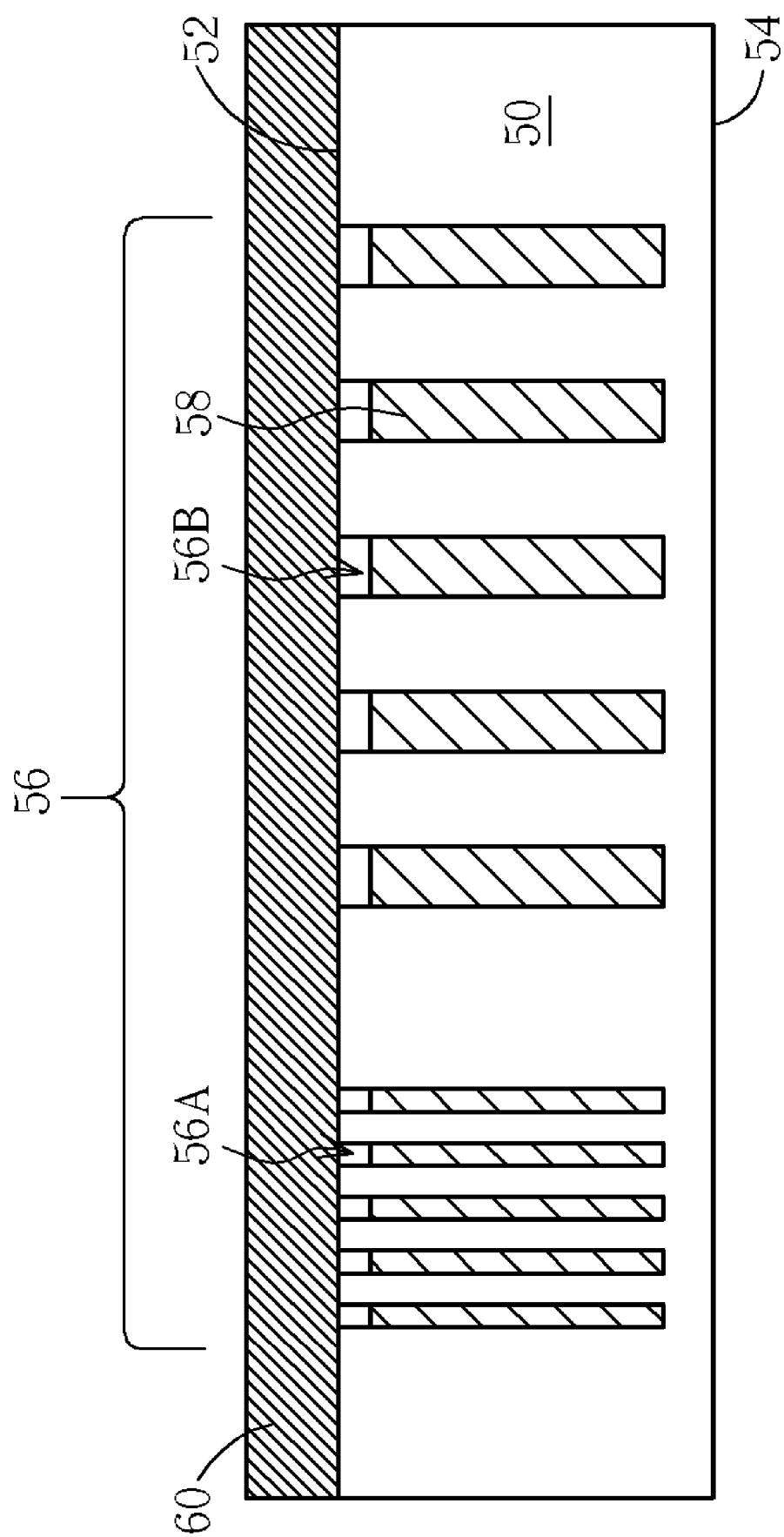

As shown in FIG. 6, the low-viscosity fluid 58 has a good mobility; therefore, it will fill into the holes 56A and 56B. As shown in FIG. 7, a high-viscosity fluid (second photoresist solution) 60 is formed on the front surface 52 of the wafer 50. The high-viscosity fluid 60 has a viscosity index of between 100 and 800 cP and a preferred viscosity index of 400 cP. In the present embodiment, the high-viscosity fluid is photoresist solution and the range of viscosity index is obtained by adjusting the composition of solutes and solvents. However, the high-viscosity fluid is not limited to photoresist solution. Other fluids with analogous properties can also be selected and additives can be included as required.

Figure 8:
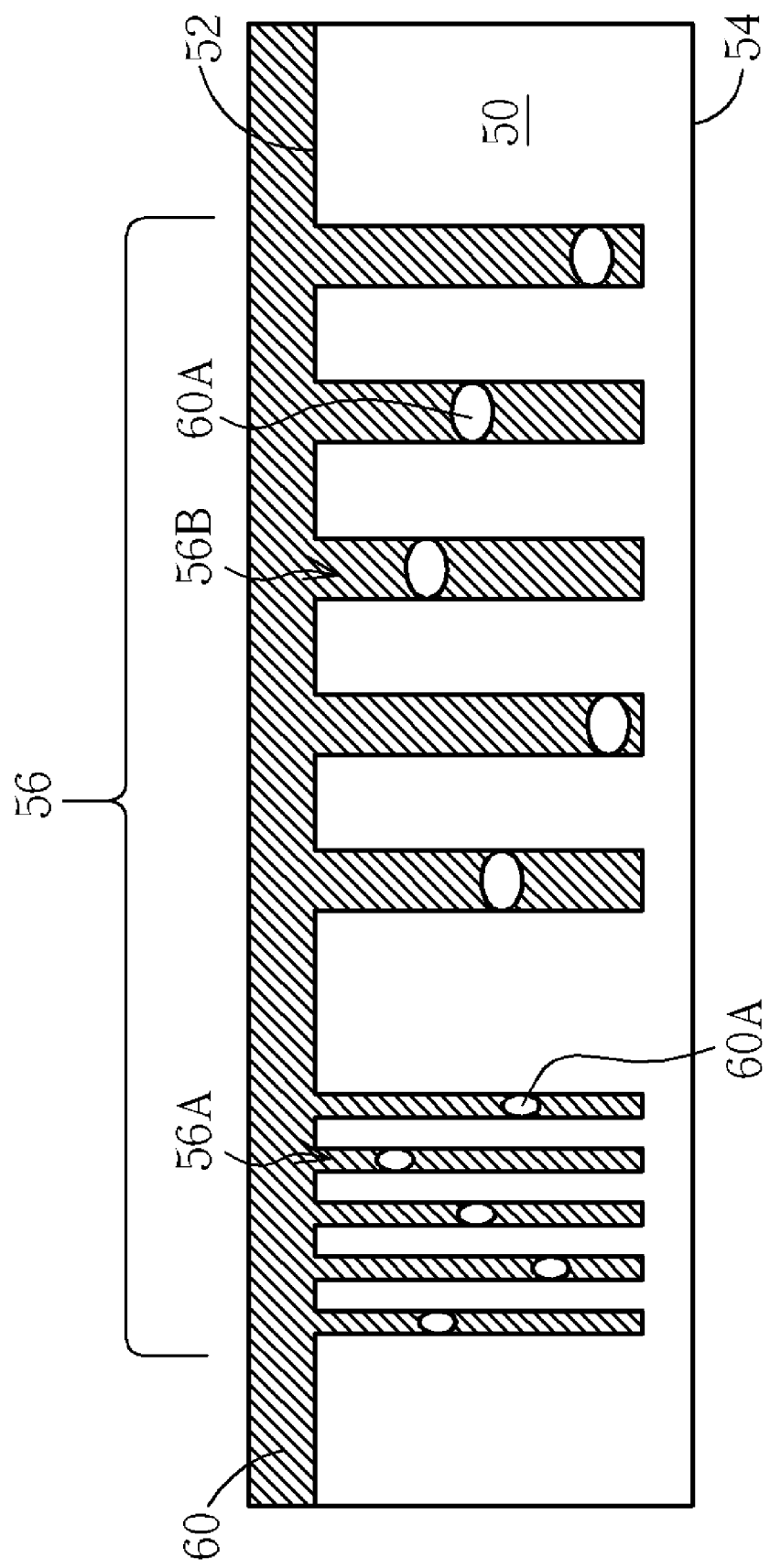
Figure 9:
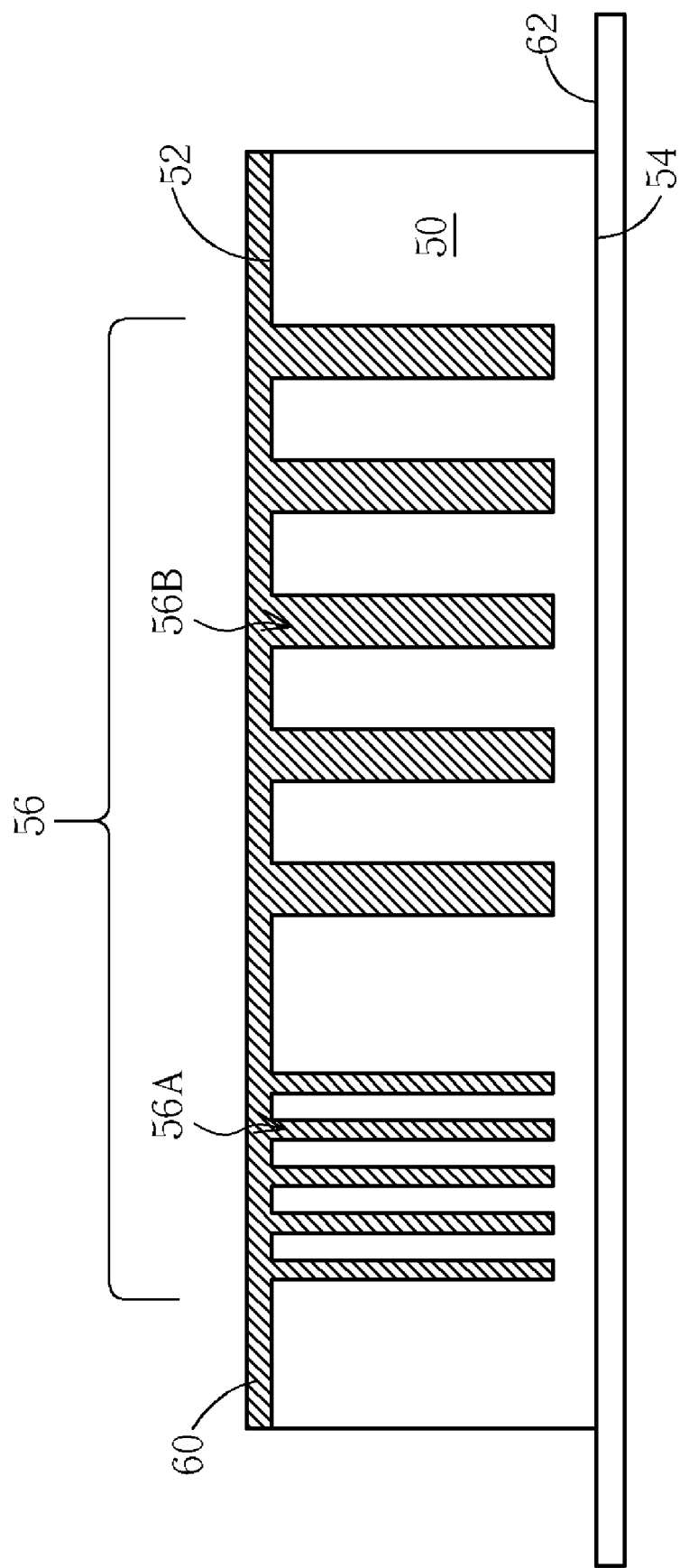

As shown in FIG. 8, the high-viscosity fluid 60 fills into the holes 56A and 56B by diffusion. The wafer is spinning to adjust the thickness of high-viscosity fluid 60 by controlling the speed of revolution. As shown in FIG. 9, it is possible that the high-viscosity fluid has higher viscosity and gas 60A is formed in the holes 56A and 56B. The gas 60A is formed more easily in holes 56A with large ratio of depth to width. For these reasons, the present embodiment performs a gradual heating process afterward to expel the gas 60A from the holes 56A and 56B. This process reduces residual gas 60A and has the capability of solidifying high-viscosity fluid. In the present embodiment, the wafer 50 is heated up gradually to about 150° C. by a hot plate 62 to expel the residual gas 60A from the holes 56A and 56B. The heating process of the present invention can also be performed by other ways, such as IR radiation or convection to obtain to object of expelling the gas 60A.

Figure 10:
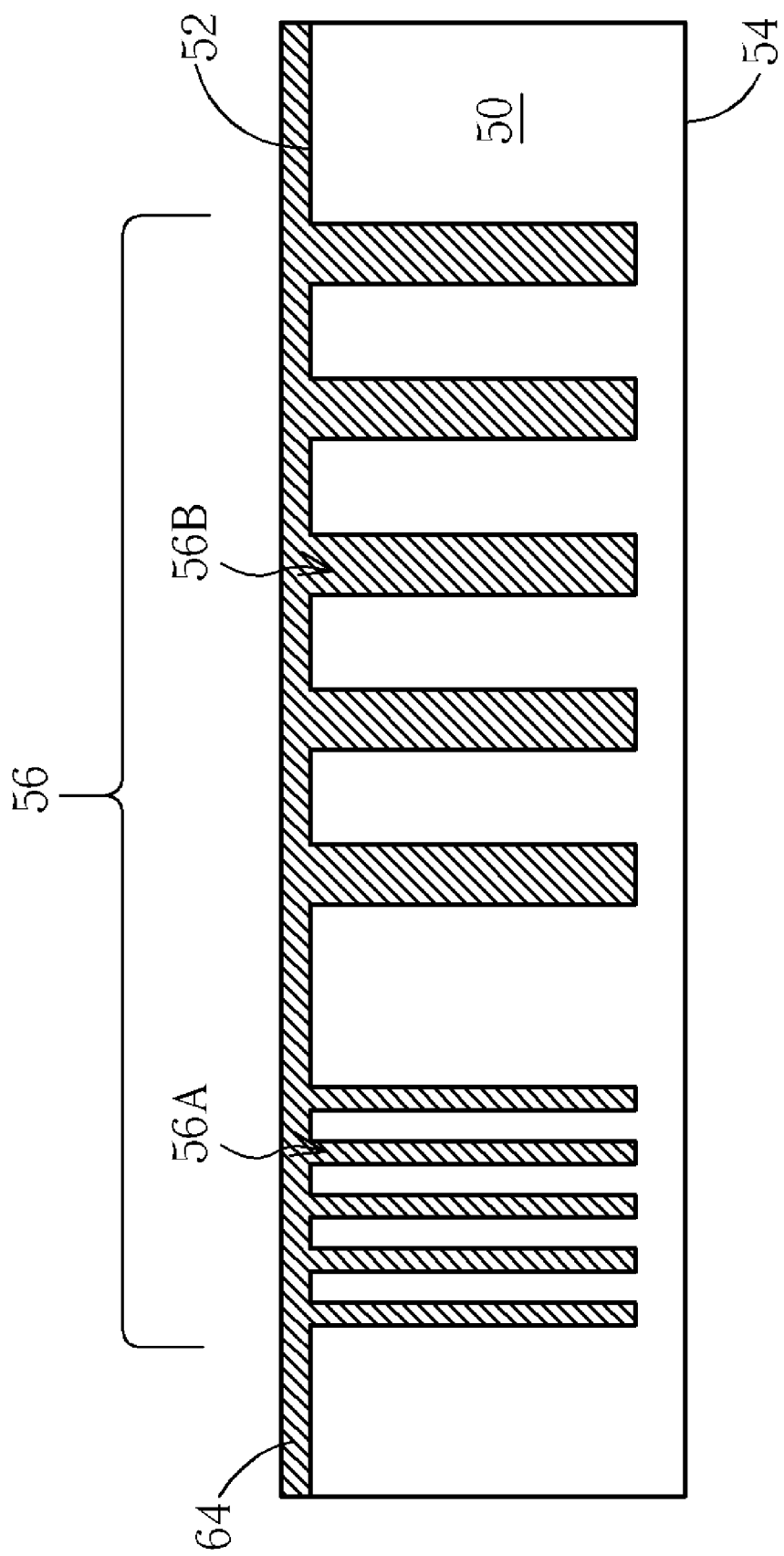

As shown in FIG. 10, after the gas 60A is expelled from the holes 56A and 56B, the high-viscosity fluid 60 is solidified and forms a protecting cap 64 on the front surface 52 of the wafer 50 to protect the wafer front pattern. After the front surface 52 of the wafer 50 is well protected, the protecting cap 64 is attached to a supporting carrier, such as an electrostatic chuck (not shown in the schematic diagram), to turn over the wafer 50 for the back process. In such cases, the required element is under further construction. Therefore, because of the protection of the front pattern 56 of the wafer 50, the method of the present invention can manufacture highly reliable MEMS devices successfully.

It can be seen that the high-viscosity fluid 60 is filled into the holes 56A and 56B by diffusion and that the heating process is performed gradually. Not only is the formation of the gas 60A in the holes 56A and 56B avoided, but also the high-viscosity fluid is solidified to form the protecting cap 64. Consequently, the front pattern 56 is protected effectively. As long as the front surface of the wafer 50 is well protected, the back process can be performed to construct the required structure of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of performing double-sided process capable of protecting a wafer front pattern, the method comprising:
   providing a wafer comprising a front surface and a back surface;
   performing a front process to form a front pattern on the front surface, the front pattern having a plurality of holes;
   forming a first photoresist solution on the front surface of the wafer, the first photoresist solution being filled into the holes;
   forming a second photoresist solution on the front surface of the wafer, the second photoresist solution being filled into the holes by diffusion; and
   attaching the front surface of the wafer to a supporting carrier and performing a back process on the back surface of the wafer.

2. The method of claim 1, further comprising performing a heating process to expel the first photoresist solution from the holes after filling the second photoresist solution into the holes.

3. The method of claim 2, wherein the heating process is performed gradually.

4. The method of claim 1, wherein the first photoresist solution has a viscosity index of between 10 and 50 centipoise (cP).

5. The method of claim 1, wherein the second photoresist solution has a viscosity index between 100 and 800 cP.

6. The method of claim 1, wherein the first photoresist solution has a smaller viscosity index than the second photoresist solution.

7. The method of claim 2, wherein the heating process further solidifies the second photoresist solution to form a protecting cap to protect the front pattern.

* * * * *